US009935542B2

(12) United States Patent
Zangi et al.

(10) Patent No.: US 9,935,542 B2
(45) Date of Patent: Apr. 3, 2018

(54) METHODS AND APPARATUSES FOR ADAPTIVE DYNAMIC VOLTAGE CONTROL FOR OPTIMIZING ENERGY PER OPERATION PER A GIVEN TARGET SPEED

(71) Applicants: Uzi Zangi, Hod-Hasharon (IL); Neil Feldman, Misgav (IL)

(72) Inventors: Uzi Zangi, Hod-Hasharon (IL); Neil Feldman, Misgav (IL)

(73) Assignee: PLSense Ltd., Yokneam Elit (IL)

(*) Notice: Subject to any disclaimer, the term of this patent is extended or adjusted under 35 U.S.C. 154(b) by 126 days.

(21) Appl. No.: 15/060,988

(22) Filed: Mar. 4, 2016

(65) Prior Publication Data

US 2016/0267208 A1    Sep. 15, 2016

Related U.S. Application Data

(60) Provisional application No. 62/133,382, filed on Mar. 15, 2015.

(51) Int. Cl.
| | |
|---|---|
| *H02M 3/157* | (2006.01) |
| *G06F 17/50* | (2006.01) |
| *G06F 1/10* | (2006.01) |
| *H03L 7/08* | (2006.01) |
| *H02M 1/00* | (2006.01) |

(52) U.S. Cl.
CPC ............. *H02M 3/157* (2013.01); *G06F 1/10* (2013.01); *G06F 17/5045* (2013.01); *H02M 2001/0032* (2013.01); *H03L 7/0802* (2013.01); *Y02B 70/16* (2013.01)

(58) Field of Classification Search
CPC ..... G06F 17/5045; G06F 1/10; H03L 7/0802; G01R 19/2506
See application file for complete search history.

(56) References Cited

U.S. PATENT DOCUMENTS

| | | | |
|---|---|---|---|
| 6,522,182 B2 * | 2/2003 | Tomita ................. | G11C 7/1072 327/152 |
| 6,967,522 B2 * | 11/2005 | Chandrakasan ........ | G05F 3/205 327/534 |
| 7,973,594 B2 * | 7/2011 | Amrutur ............ | H03K 19/0008 327/534 |
| 8,502,590 B2 * | 8/2013 | Friddell ................ | G06F 1/3203 327/333 |
| 9,244,515 B2 * | 1/2016 | Kawasaki ............. | G06F 1/3203 |
| 2012/0159276 A1 * | 6/2012 | Zandian ............. | G01R 31/3016 714/734 |
| 2013/0222018 A1 * | 8/2013 | Park ...................... | H03L 7/0802 327/142 |
| 2014/0070879 A1 * | 3/2014 | Kawasaki ............. | G06F 1/3203 327/543 |
| 2014/0176189 A1 * | 6/2014 | Wang ................... | H03K 3/0375 326/81 |
| 2014/0247088 A1 * | 9/2014 | Prager ................ | H03K 19/0008 327/544 |

(Continued)

*Primary Examiner* — Helen Rossoshek

(57) ABSTRACT

A method for implementing a Semiconductor Integrated Circuit device using Near/Sub-threshold technology with SOFTWARE programmable Adaptive Dynamic Voltage Control (ADVC) algorithm using different sensors inside the chip in order to improve the target speed and reduce the energy per operation of the final product. This method achieves the best power per performance for a given solution operating at a required speed.

10 Claims, 4 Drawing Sheets example schematic of the Power Management Unit (PMU)

first fail circuit top level

(56) References Cited

U.S. PATENT DOCUMENTS

| | | | |
|---|---|---|---|
| 2014/0250313 A1* | 9/2014 | Marr | H03K 19/096 713/320 |
| 2016/0013792 A1* | 1/2016 | Ashouei | G11C 29/021 327/543 |
| 2016/0105162 A1* | 4/2016 | Zangi | G06F 1/324 327/530 |
| 2016/0283630 A1* | 9/2016 | Zangi | G06F 17/5045 |

* cited by examiner

Figure 1 – example schematic of the Power Management Unit (PMU)
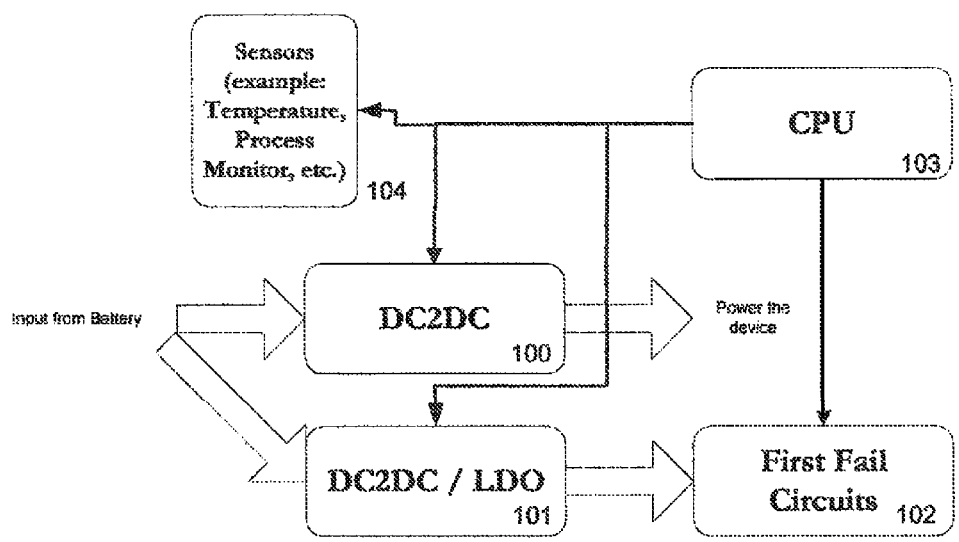

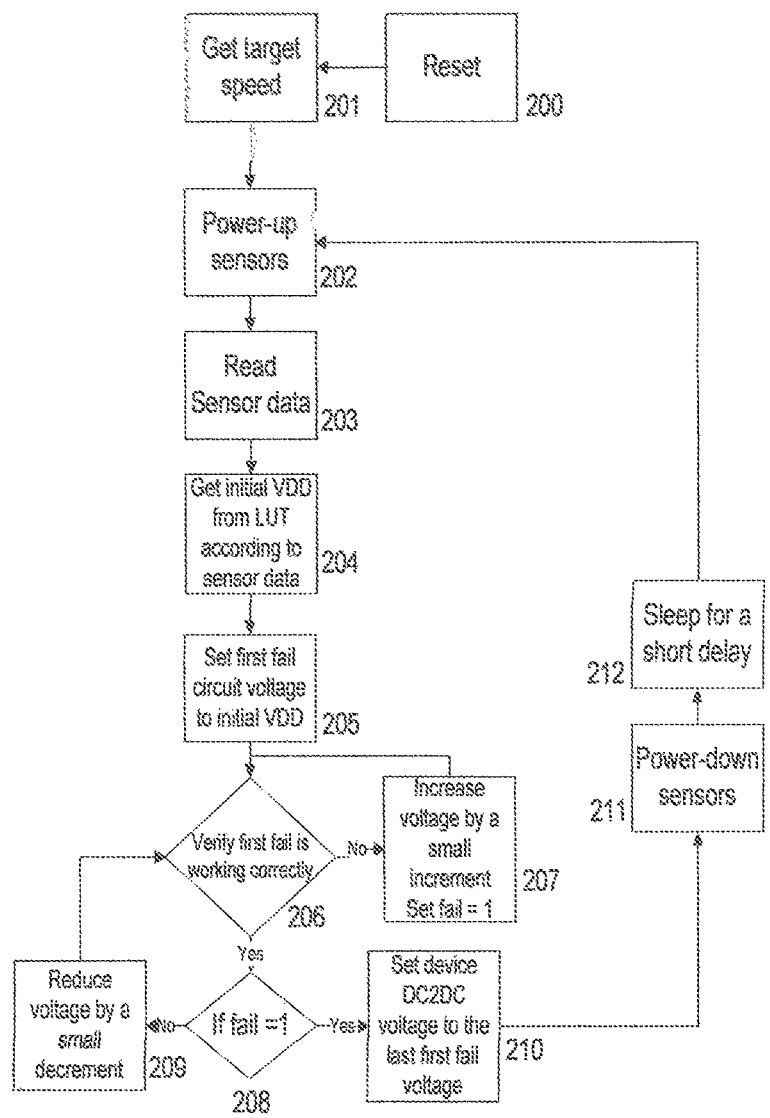

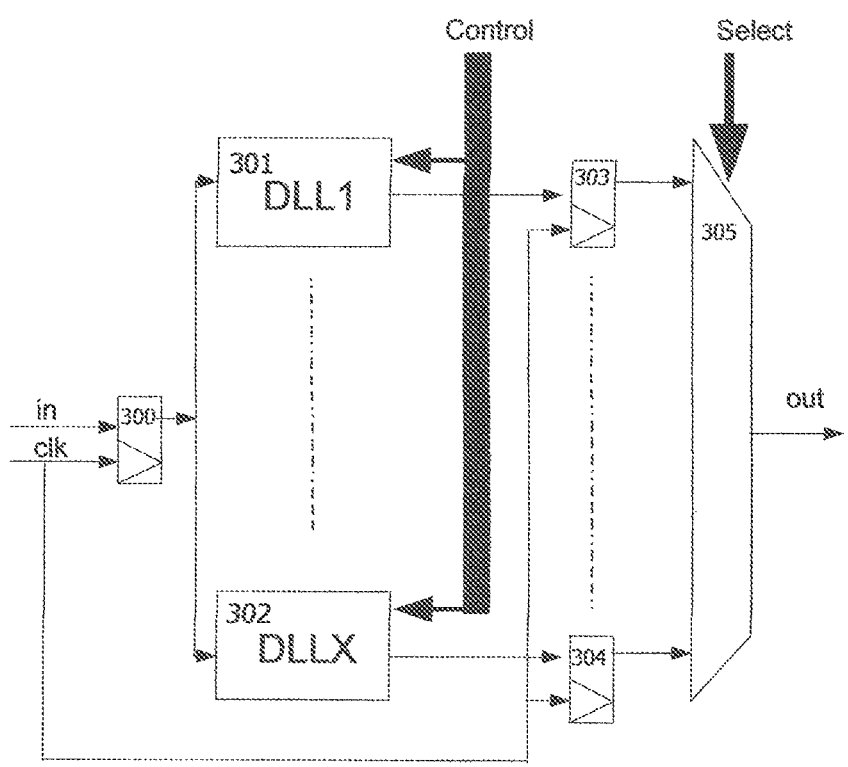

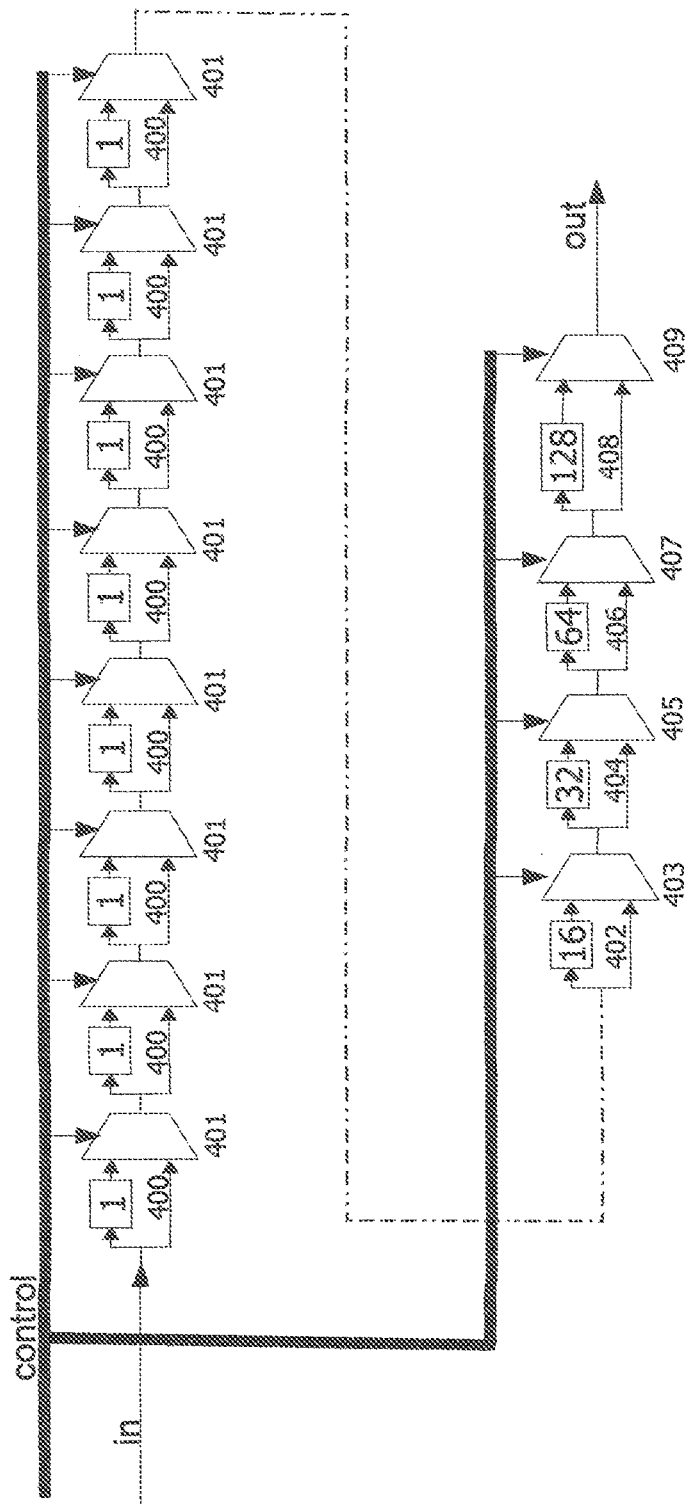
Figure 4 - first fail DLL circuit

METHODS AND APPARATUSES FOR ADAPTIVE DYNAMIC VOLTAGE CONTROL FOR OPTIMIZING ENERGY PER OPERATION PER A GIVEN TARGET SPEED

FIELD

Embodiments of the invention relate generally to the field of silicon design and more specifically to a Near/Sub-threshold implementation that optimizing energy per operation for a given design and target speed.

BACKGROUND

Many new emerging applications require the use of ultra-low power consumption solutions inside a chip. This will allow them to be incorporated into devices that operate from a small non-chargeable battery for very long periods without the need to frequently charge the battery. For example, wearable, mobile and Medical devices which are battery operated may require an ultra-low power solution.

Reducing the operating voltage is the most effective method for power reduction and working at the Near/Sub-threshold voltage domain can save 70-80% from the dynamic power consumption and 80-90% from the leakage power. Near/Sub-threshold technology is a way of operating the CMOS transistors in their weak inversion state where the transistors are never fully turned on. When operating in the Near/Sub-threshold region, the transistor state varies between being fully turned off and partially turned on.

When operating in the Near/Sub-threshold region, transistors operate at a near or lower voltage than their threshold voltage (known as VT) and by such operation the transistor use less power. During Near/Sub-threshold voltage operation, both dynamic power and static power are reduced. Dynamic power is a ratio of the operating voltage by a power of two and the static power at this Sub-threshold voltage domain is also at exponential ratio of the operating voltage, therefore reducing the operating voltage of the device to a Near/Sub-threshold voltage level will reduce the energy per operation dramatically.

One of the major limiting factors for using Near/Sub-threshold technology is the low speed performance of the transistors that goes down in an exponential ratio compared to the voltage drop and due to this limitation the usage of Near/Sub-threshold technology in commercial chips is very limited.

The second limiting factor is the deep sub-micron process variation and the requirement during the design phase to ensure that the device performance is met in the worst case condition of the process. This causes a large overhead during the design and increases area and power dramatically. In today's solutions which try to maximize the maximum achievable speed at worst case conditions, which represent less than 1% of the material in production, a huge overhead is paid in area and power for all the material.

Various methods and implementations for the Near/Sub-threshold technology exist today that focus only on power reduction and not on the optimal way to use this technology for a given power per performance required by a specific application or how to improve the target performance per a given target operating voltage.

In order for this technology to have practical application, a method is required that optimizes power consumption while still meeting the performance requirements for a specific product or application.

SUMMARY

For one embodiment of the invention, a Near/Sub-threshold technology flow implementation is provided that optimizes energy per operation for a given performance requirement by optimizing dynamically and adaptively the operating voltage level per a given process corner and temperature. These parameters are sampled on the fly from the silicon.

Additionally, embodiments of the invention also include implementation and characterization of a library that is optimized for use at Near/Sub-threshold voltage levels, and that can support dynamic change of the voltage from the Sub-threshold levels up to the high voltage levels.

Embodiments of the invention allow a Near/Sub-threshold implementation of ultra-low power design flow. Embodiments of the invention may be used by any system which requires ultra-low power consumption.

Additionally, embodiments also include implementation of a programmable DC2DC convertor which connects directly to the external battery and supplies the needed operating voltage of the device core. This DC2DC output voltage is programmable and can be changed via a CPU command. The DC2DC output voltage range is programmable from Sub-threshold voltage levels up to high voltage levels with a small increment of a few mV.

Additionally, embodiments of the invention may also include one or more special sensors inside the chip for checking performance and temperature monitoring which help to determine the required operating voltage for the device.

Additionally, embodiments of the invention may also include one or more special first fail circuits which can be used to represent the worst case path of the logic or memory design and are capable of operating from a different power source than the device power source.

Additionally, embodiments also include a SOFTWARE programmable algorithm to verify adaptively and dynamically the needed operating voltage for the target speed on the first fail circuits and then implement this voltage for the rest of the device.

BRIEF DESCRIPTION OF THE DRAWINGS

The invention may be understood by referring to the following description and accompanying drawings that are used to illustrate embodiments of the invention. In the drawings:

FIG. 1 illustrates example schematic of the Power Management Unit (PMU) that includes the DC2DC, LDO, First fail circuits, CPU and sensors;

FIG. 2 illustrates the SOFTWARE algorithm flow chart for the Adaptive Dynamic Voltage Control (ADVC) which is used to make a decision on the optimal operating voltage to be used according to the inputs from the different sensors and the given target speed;

FIG. 3 illustrates an example schematic of the structure of the first fail top level circuit;

FIG. 4 illustrates an example design of the DLL design used in the first fail circuit;

DETAILED DESCRIPTION

A flow to design a Near/Sub-Threshold solution ASIC using SOFTWARE programmable Adaptive Dynamic Voltage Control (ADVC) to improve the device power performance and to ensure optimal energy per operation for a given required speed or target operation.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

For one embodiment of the invention, the implementation may be effected using SOFTWARE control on the operating voltage to improve the device power per given performance. By increasing the operating voltage, the performance increases exponentially while the dynamic power increase only by the power of two. However, the Adaptive Dynamic Voltage Control (ADVC) algorithm defines the operating voltage to be the lowest possible voltage at which the device operates correctly.

For another embodiment of the invention, the decision on the correct operating voltage for the device is done using different sensors which exist inside the silicon such as temperature sensors or process monitor sensors or other unique sensors as shown at FIG. 1 block 104 and also a first fail circuit as shown at FIG. 1 block 102 and a SOFTWARE algorithm that checks both sensors output and also the performance of the first fail circuits which are built to be the worst case path of the logic design per a specific device. The first fail circuit is connected to a different power source which can also be controlled by the SOFTWARE without influencing the rest of the logic voltage, the SOFTWARE changes this voltage level up and down until the first fail circuit goes from non-functional state to functional state and utilizes this information to know the lowest optimal voltage which is needed for the design to operate correctly.

For another embodiment of the invention, the implementation uses an exemplary circuit of a Power Management Unit (PMU) block. This block includes a programmable DC2DC block (item 100 in FIG. 1) which generates the required voltage to operate the digital logic of the device from the battery input, a programmable LDO block (item 101 in FIG. 1) which generates the required voltage for the first fail circuits from the battery input. The implementation also includes a CPU block (item 103 in FIG. 1) which runs the ADVC SOFTWARE algorithm that controls the different blocks inside the PMU, reads the on chip sensors and operates the first fail circuit to determine the correct operational voltage level For another embodiment of the invention, the implementation includes a SOFTWARE algorithm for Adaptive Dynamic Voltage Control (ADVC) that calculates the optimal voltage to be used for the design per a given required frequency as shown in FIG. 2. The process shown in FIG. 2 begins with reset or wake-up of the CPU (box 200 in FIG. 2) which reads the target speed from the Flash or gets it from the higher level SOFTWARE (box 201 in FIG. 2). Then the CPU powers-up the different sensors inside the device (box 202 in FIG. 2) and reads different sensors data (box 203 in FIG. 2). From the data that was read from the different sensors the CPU calculates the target operating voltage per the given target frequency (box 204 in FIG. 2). The CPU then sets the initial voltage for the first fail circuit to give the target voltage as was calculated (box 205 in FIG. 2). Then the CPU checks the correct operation of the first fail circuit (box 206 in FIG. 2). If the first fail circuit fails to operate correctly, then the CPU sets the fail register and increases the first fail voltage output by a small increment for (box 207 in FIG. 2). Then the CPU checks again the operation of the first fail circuit and if again it's not working correctly it raises the voltage of the first fail by another small increment. The CPU continues with this loop until it gets the first fail circuit to work correctly. When the first fail circuit works correctly the CPU checks if the fail flag equals 1 (box 208 in FIG. 2), if not then the CPU knows the first fail logic didn't fail before and it can reduce the voltage by a small decrement (box 209 in FIG. 2) and go back to check the first fail circuit operation. If the fail flag equals 1 then the CPU knows the loop ended and sets the design voltage using the DC2DC output to the same value as the first fail voltage with a small increment (box 210 in FIG. 3) this changes the voltage level of the digital logic of the device to the required voltage which is the optimal voltage per the needed frequency and the device environment parameters. Then the CPU powers down the different sensors (box 211 in FIG. 2) goes to sleep for a short period (box 212 in FIG. 2) and when woken-up starts the loop again.

For another embodiment of the invention, the implementation includes a First Fail circuit which is illustrated in FIG. 3. This Figure shows the top level block diagram of the first fail circuitry in accordance with one embodiment of the invention. The first fail circuitry includes one input register (item 300 in FIG. 3) which can be written to by the CPU and few Digitally controlled delay lines (DLL) (items 301-302 in FIG. 3) and few sampling registers, according to the number of the DLL's used (items 303-304 in FIG. 3). These registers can be read back by the CPU. One of these sampling registers is read at a time using the multiplexer (item 305 in FIG. 3).

The different DLL blocks (items 301-302 in FIG. 3) are identical in circuitry, but different in implementation, with each DLL having different wire lengths between its internal circuits, which makes the delay of each DLL circuit different to represent different worst case paths in the design.

FIG. 4 describes the detailed design of the Digitally controlled delay lines (DLL) elements. These are comprised of delay cells (items 400,402,404,406,408 in FIG. 4) and multiplexers (items 401,403,405,407,409 in FIG. 4). The control bus choses per multiplexer if the path with the delay cell is chosen (control[x]==1)) or the path without the delay cell is chosen (control[x]==1)). In this way the CPU can digitally control the delay of the DLL.

For another embodiment of the invention, the first fail circuit path length is programmable and can be controlled by the SOFTWARE after the device is manufactured and characterized. With this method after performing the chip characterization the length of this first fail path can be determined to exactly represent the worst case path in the design of the digital logic of the device.

For another embodiment of the invention, the first fail circuit comprises of a few identical DLL circuits that are designed with the same circuitry, but with different wire lengths in each DLL. By using all different DLL paths, it is possible to represent worst case paths in the design of the digital logic of the device both for paths with short wires between circuitry and for paths with long wires between circuitry.

Embodiments of the invention have been described as including various operations. Many of the processes are described in their most basic form, but operations can be added to or deleted from any of the processes without departing from the scope of the invention.

What is claimed is:

1. A Semiconductor Integrated Circuit device comprising:
multiple sensors located on the Semiconductor Integrated Circuit device, said multiple sensors being selected from temperature sensors, process monitor sensors, transistor threshold voltage monitor;
a first fail circuit designed to be worst case paths of a logic design of the device;
a CPU operating a SOFTWARE algorithm, said CPU controls operating voltage of different blocks inside the device on the fly according to results from the SOFTWARE algorithm, the CPU reads the multiple sensors and operates the first fail circuit to determine the correct operational voltage level of the different blocks inside the device;
wherein the first fail circuit is connected to a second power source separate from the power source of the Semiconductor Integrated Circuit device, said second power source is controlled by the CPU without influencing the rest of the logic voltage, the SOFTWARE adjusts the voltage level until the first fail circuit goes from non-functional state to functional state, the CPU utilizes this information to know a lowest optimal voltage needed for the design to operate correctly; wherein the Semiconductor integrated Circuit device is operating in the Near or Sub threshold region; and wherein a design of the Semiconductor Integrated Circuit device includes two programmable operating voltage sources.

2. The device of claim 1 wherein the Semiconductor Integrated Circuit device is operating in the Near or Sub threshold region with an operating voltage level based upon determined performance requirements and the input samples from the on device sensors.

3. The device of claim 1 wherein the Semiconductor Integrated Circuit device includes one or more logic cells or/and SRAM (memory) cells capable of operating in the Near or Sub threshold voltage levels and wherein one or more logic cells or SRAM cells are characterized to run at the required performance and the operating voltage.

4. The device of claim 1 wherein a design of the Semiconductor Integrated Circuit device includes one or more sensors for process monitoring, temperature sensing and other sensors.

5. The device of claim 4 wherein the sensors can be read by an integrated or external CPU.

6. The device of claim 1 wherein the two programmable operating voltage sources are controlled via a SOFTWARE algorithm running on the CPU.

7. The device of claim 1 wherein a design of the Semiconductor Integrated Circuit device includes one or more first fail circuitries with an operating voltage source that is different than the rest of the devices voltage source and can be controlled through the SOFTWARE algorithm running on the CPU.

8. The device of claim 7 wherein the design of the one or more first fail circuits is to implement the worst case timing path of the logic design of a specific device.

9. The device of claim 8 wherein few different delay lines exist in the first fail circuit to implement the worst case timing path of the logic design, both for timing paths with short wires between circuitries and for timing paths with long wires between circuitries.

10. The device of claim 1 wherein the SOFTWARE algorithm combines the inputs from the multiple sensors inside the device and the results from the lowest operating voltage at which the first fail circuitry still operates correctly and uses the inputs to adjust dynamically and adaptively the operating voltage of the device to the lowest possible voltage at which the device still operates correctly.

* * * * *